United States Patent [19]
Goto et al.

[11] Patent Number: 5,895,549
[45] Date of Patent: *Apr. 20, 1999

[54] METHOD AND APPARATUS FOR ETCHING FILM LAYERS ON LARGE SUBSTRATES

[75] Inventors: Haruhiro Goto, Saratoga; Jerry Yuen-Jui Wong, Fremont; Junichi Fujimoto, Cupertino, all of Calif.

[73] Assignee: Applied Komatsu Technology, Inc., Tokyo, Japan

[*] Notice: This patent is subject to a terminal disclaimer.

[21] Appl. No.: 08/732,968

[22] Filed: Oct. 16, 1996

Related U.S. Application Data

[63] Continuation-in-part of application No. 08/273,382, Jul. 11, 1994, Pat. No. 5,753,133.

[51] Int. Cl.⁶ .................................................. B05C 11/00
[52] U.S. Cl. .................. 156/345; 216/67; 118/503; 118/728; 118/729; 414/936; 414/941; 414/939; 438/716
[58] Field of Search ................ 156/345; 118/500, 118/503, 728, 729; 438/716; 216/58, 67; 414/936, 941, 939

[56] References Cited

U.S. PATENT DOCUMENTS

| | | |
|---|---|---|
| 3,993,909 | 11/1976 | Drews et al. |
| 4,376,672 | 3/1983 | Wang et al. |
| 4,419,076 | 12/1983 | Kirshman . |
| 4,553,069 | 11/1985 | Purser . |
| 4,579,080 | 4/1986 | Martin et al. |
| 4,728,389 | 3/1988 | Logar . |
| 4,788,994 | 12/1988 | Shinbara . |
| 4,842,683 | 6/1989 | Cheng et al. |
| 4,911,597 | 3/1990 | Maydan et al. |
| 5,100,502 | 3/1992 | Murdoch et al. |
| 5,104,276 | 4/1992 | Severns et al. |
| 5,154,730 | 10/1992 | Hodos et al. |
| 5,183,245 | 2/1993 | DiNapoli et al. |
| 5,268,067 | 12/1993 | Dostalik et al. |

*Primary Examiner*—Thi Dang
*Attorney, Agent, or Firm*—Fish & Richardson P.C.

[57] ABSTRACT

A chamber for etching substrates includes a support member therein which is suspended from a sidewall of the chamber. The support member includes multiple planar faces for receiving substrates thereon, and is rotatable about a horizontal axis to position the multiple planar faces in a horizontal position to place the substrates on the planar faces or remove the substrates from the planar faces, and a second position to place the substrates in a non-horizontal position for processing. A clamping and lifting apparatus is provided on the support member that is positionable, with respect to the support member, in an extended position to permit a substrate to be positioned between the clamping and lifting apparatus and the support member, and in a retracted position to clamp the substrate to the support member.

The chamber is especially adapted to etching substrates requiring high power densities, such as substrates having aluminum films, without causing arcing. The chamber may include: insulative members disposed between the support member and the clamping and lifting apparatus, spacers disposed in the clamping and lifting apparatus for providing a gap between the clamping and lifting apparatus and the substrates, and lift pins disposed in the support member for moving the substrates toward or away from the support member. The substrate receiving faces may be non-parallel to each other.

10 Claims, 10 Drawing Sheets

METHOD AND APPARATUS FOR ETCHING FILM LAYERS ON LARGE SUBSTRATES

CROSS-REFERENCE TO RELATED APPLICATIONS

This application is a continuation-in-part of U.S. patent application Ser. No. 08/273,382, filed Jul. 11, 1994, now U.S. Pat. No. 5,753,133 and entitled "METHOD AND APPARATUS FOR ETCHING FILM LAYERS ON LARGE SUBSTRATES", which is incorporated herein by reference.

BACKGROUND OF THE INVENTION

1. Field of the Invention

The present invention relates to the field of etching of film layers on substrates, including the etching of film layers formed on semiconductor substrates and on insulative substrates, such as glass substrates, to selectively remove portions of the film layer. More particularly, the present invention has application to the etching of film layers on large planar surfaces such as those encountered in the fabrication of large flat panel displays.

2. Background of the Art

Selective etching of film layers on semiconductor substrates is well known. For example, U.S. Pat. No. 4,367,672, Wang, et al., fully incorporated herein by reference, discloses methods of using a plasma to selectively etch holes or trenches in a film layer on a semiconductor substrate. Currently used semiconductor substrates are typically circular, having a diameter of no more than 200 mm, a thickness of less than 0.5 mm, and a mass of no more than approximately 60 g. Because of the relatively small size and weight of the semiconductor substrate, relatively straightforward etch chamber configurations may be used to provide the etch process environment to selectively etch a film layer on the substrate, and relatively straightforward wafer handling equipment may be used to load the substrates into processing chambers.

The process for manufacturing flat panel displays uses many of the same processes used to fabricate semiconductor devices. The manufacture of the flat panel display begins with a clean glass substrate. Transistors are formed on the flat panel using film deposition and selective etching techniques similar to those described in the aforementioned Wang, et al. patent. Sequential deposition, photolithography and selective etching of film layers on the substrate creates individual transistors on the substrate. These devices, as well as metallic interconnects, liquid crystal cells and other devices formed on the substrate are then used to create active matrix display screens on the substrate to create a flat panel display in which display states are electrically created in the individual pixels.

Although the flat panel display is typically manufactured using the same processes as those used in semiconductor device fabrication, the glass used as the flat panel display substrate is different than a semiconductor substrate in several important respects that affect its processing. In semiconductor fabrication, individual devices are formed on the wafer, and the wafer is diced to form multiple individual integrated circuits. Thus, the creation of some defective devices on the semiconductor wafer is tolerated, because the die bearing these defective devices are simply discarded once the substrate is sawn into individual integrated circuits. On the flat panel display, individual defective devices must not be removed. Therefore, the number of defective devices created on the flat panel substrate must approach zero. If a substrate is sufficiently large to process multiple displays on a single substrate, a defect in any one of the flat panel displays being formed on the flat panel substrate renders that display defective. Additionally, the glass substrates are typically substantially larger than the largest semiconductor wafers, and the coefficient of heat transfer of the glass substrate is approximately 100 times less than the coefficient of heat transfer of the semiconductor substrate.

In semiconductor processing, in particular etch processing, the process environment transfers substantial energy into the substrate, and this raises the temperature of the substrate if the energy is not distributed away from the surface of the substrate and/or removed from the substrate at the same rate as it enters the substrate. In semiconductor substrate processing, the substrate temperature is maintained at a desired level by balancing the energy transferred into the substrate by the process environment with the combination of the capacity of the substrate to distribute the heat away from the surface and the rate at which heat is transferred from the substrate into the substrate support member. As the substrate is heated by the process environment, the temperature of the substrate outer surface is raised by the energy transferred into the substrate. As the etch process continues, the heat conducts into the substrate to raise the temperature in the remainder of the substrate. A portion of this heat is eventually conducted into the support member. By balancing the total energy transferred into the substrate during the etch process, and the rate of energy transfer into the substrate, the temperature of the substrate surface may be maintained below the resist breakdown temperature of 120 degrees Celsius.

Where a substrate is received on a support member but not firmly chucked thereto, the rate of heat transfer from the substrate into the support member is relatively small because the vacuum process environment substantially prevents conductive heat transfer between the substrate and the support member in areas where the support member and the substrate are not in intimate contact. Therefore, where the substrate is simply mechanically coupled to the support member, the power must be maintained at relatively low levels so that the energy input into the substrate does not exceed the combination of the rate of heat transfer from the substrate into the support member and the diffusion of the heat energy within the substrate. However, because etch rate and power density are approximately directly proportional, these low energy levels limit throughput of substrates through the chamber because longer process times are required to effect a desired etch. To increase heat transfer, and thus throughput, the substrate may be clamped to the support member. This method of controlling the temperature of semiconductor substrates may also be adapted to the processing of flat panel display substrates.

In flat panel display substrate processing, the large, rectangular, glass sheet used as the substrate is heavy and bulky but nonetheless fragile, and cannot be easily manipulated between the horizontal and vertical planes. Therefore, the plasma etch processes used to selectively etch the film layer on a flat panel substrate are typically performed with the substrate located in a horizontal position, because it is easier to handle the substrate in process if it is loaded into a process chamber in the horizontal plane.

A flat panel display substrate etched in a horizontal position, however, is prone to the formation of defects. In the typical etch process for a horizontal flat panel substrate, the etch plasma is maintained within the chamber enclosure above the substrate. Therefore, as the film layer is etched, contaminants in the enclosure fall by the force of gravity onto the substrate, and contaminants may also be electrostatically attracted to the substrate. Each of these contaminants above a threshold size will produce a defect in a flat panel formed on the substrate.

The process chemistries used to create flat panel displays using amorphous silicon layers also contribute to the creation of defective displays. In flat panel display substrates, the holes or trenches etched in the film layers must typically have tapered walls. Typically, where the layer being etched is amorphous silicon, fluorine based chemistries are used for etching. To provide the tapered side walls using a fluorine based chemistry, oxygen is introduced into the etch chemistry. As the fluorine based chemistry etches the film layer, the oxygen continuously etches the edge of the resist to continuously reduce the width of the resist and thus increase the width of the area of the film being etched to create the desired tapered walls. However, the oxygen used to etch the edge of the resist also forms particle contaminants in the chamber, which, if received on the substrate, will cause a particle defect.

Therefore, there exists a need in the art for substrate processing equipment that will allow etching of large substrates, such as for flat panel displays, with maximum throughput and minimal process variation.

SUMMARY OF THE INVENTION

The present invention provides an etch chamber for etching film layers on large substrates, such as for flat panel displays, wherein the film layers on the exposed surfaces of multiple substrates may be simultaneously etched in a single etch chamber.

The chamber includes a substrate support member, having multiple substrate receiving faces, rotatable about a horizontal axis to position the substrate receiving faces of the support member in a horizontal plane for the loading of substrates onto, or removal of substrates from, the substrate support member.

The substrate support member is preferably configured to receive two substrates thereon for simultaneous processing in the chamber. Where the substrate support member is configured to simultaneously process two substrates, the substrates may be placed on opposed sides of the substrate support member, and loaded into the chamber in a horizontal position and, after placement on the substrate support member, rotated to place the substrates in a vertical, or nearly vertical, position for etching.

A clamping and lifting apparatus is provided on the support member. The clamping and lifting apparatus is positionable, with respect to the support member, in an extended position to permit a substrate to be positioned between the clamping and lifting apparatus and the support member, and in a retracted position to clamp the substrate to the support member. The substrate is clamped to the support member to secure the substrate as the support member is rotated in the chamber.

The chamber is especially adapted to etching substrates requiring high power densities, such as substrates having aluminum films, without causing arcing. The chamber may include: insulative members disposed between the support member and the clamping and lifting apparatus, spacers disposed in the clamping and lifting apparatus for providing a gap between the clamping and lifting apparatus and the substrates, and lift pins disposed in the support member for moving the substrates toward or away from the support member. The substrate receiving faces may be non-parallel to each other.

BRIEF DESCRIPTION OF THE DRAWINGS

The accompanying drawings, which are incorporated in and constitute a part of the specification, schematically illustrate a representative embodiment of the invention and, together with the general description given above and the detailed description of the representative embodiment given below, serve to explain the principles of the invention.

DESCRIPTION OF THE EMBODIMENTS

Introduction to the Apparatus

Figure 1:
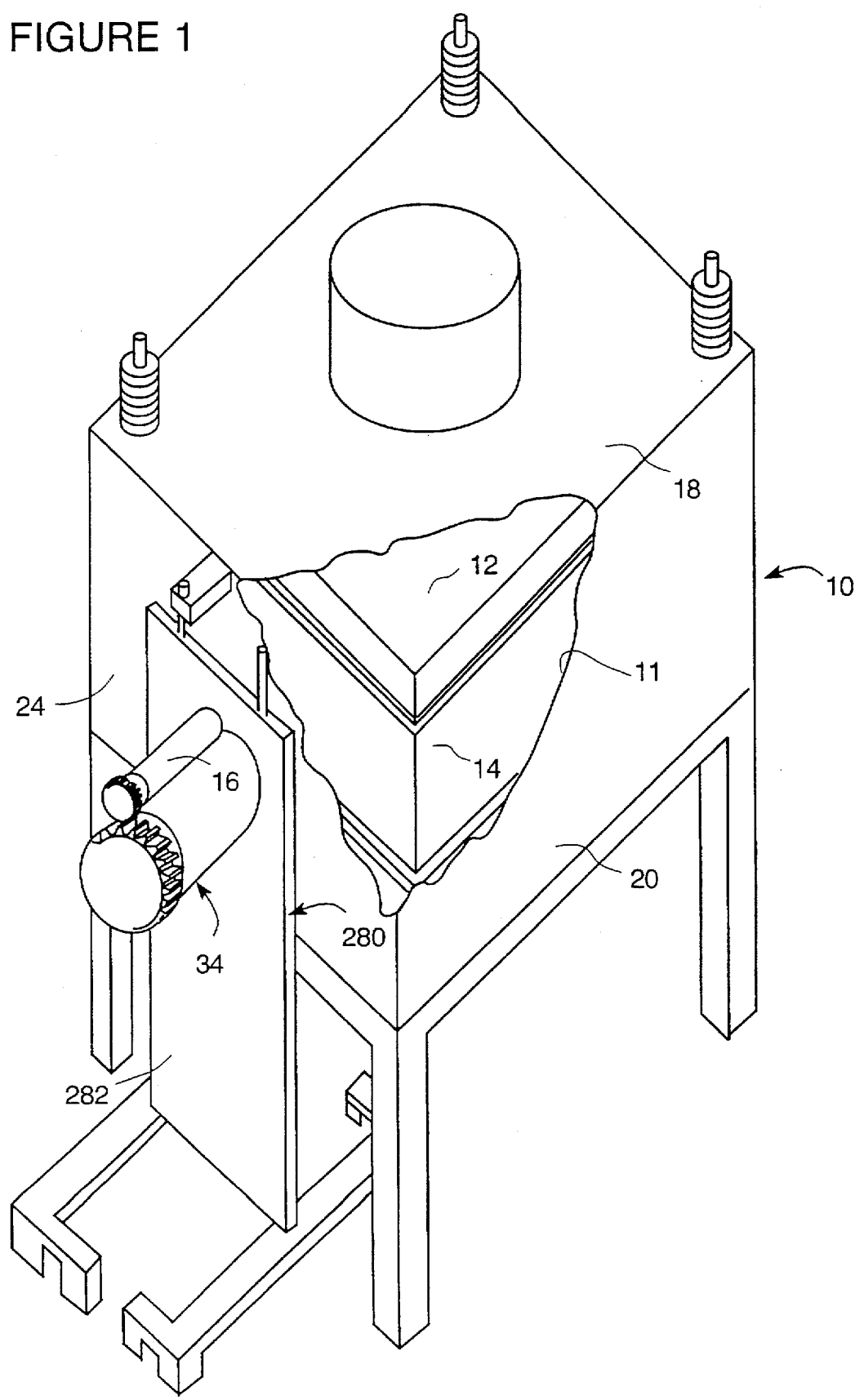
FIG. 1 is a perspective view, partially in section, of the etch chamber and support stand of the present invention with the support member positioned for the loading of substrates into the chamber and unloading of substrates from the chamber.

The present invention provides a chamber for the etching of substrates. The chamber may be configured as an etch chamber 10, as shown in FIG. 1, for plasma etching the surface of a flat panel display substrate 12 or other substrate, wherein the substrates 12 are maintained in a horizontal plane as they are loaded into, or removed from, the chamber 10, and the substrates 12 are rotated to a vertical plane for the etch cycle. The chamber 10 is preferably configured as a reactive ion etch chamber, wherein the substrates 12 are received on a support member 14 which is preferably maintained at a negative self-biasing voltage with an R.F. voltage source at approximately 13.5 MHz, which may be capacitively coupled, the chamber 10 is maintained at a vacuum pressure, and an etching gas species is charged into the chamber 10 and sparked into a plasma by the R.F. voltage source.

The Etch Chamber Configuration

Figure 2:
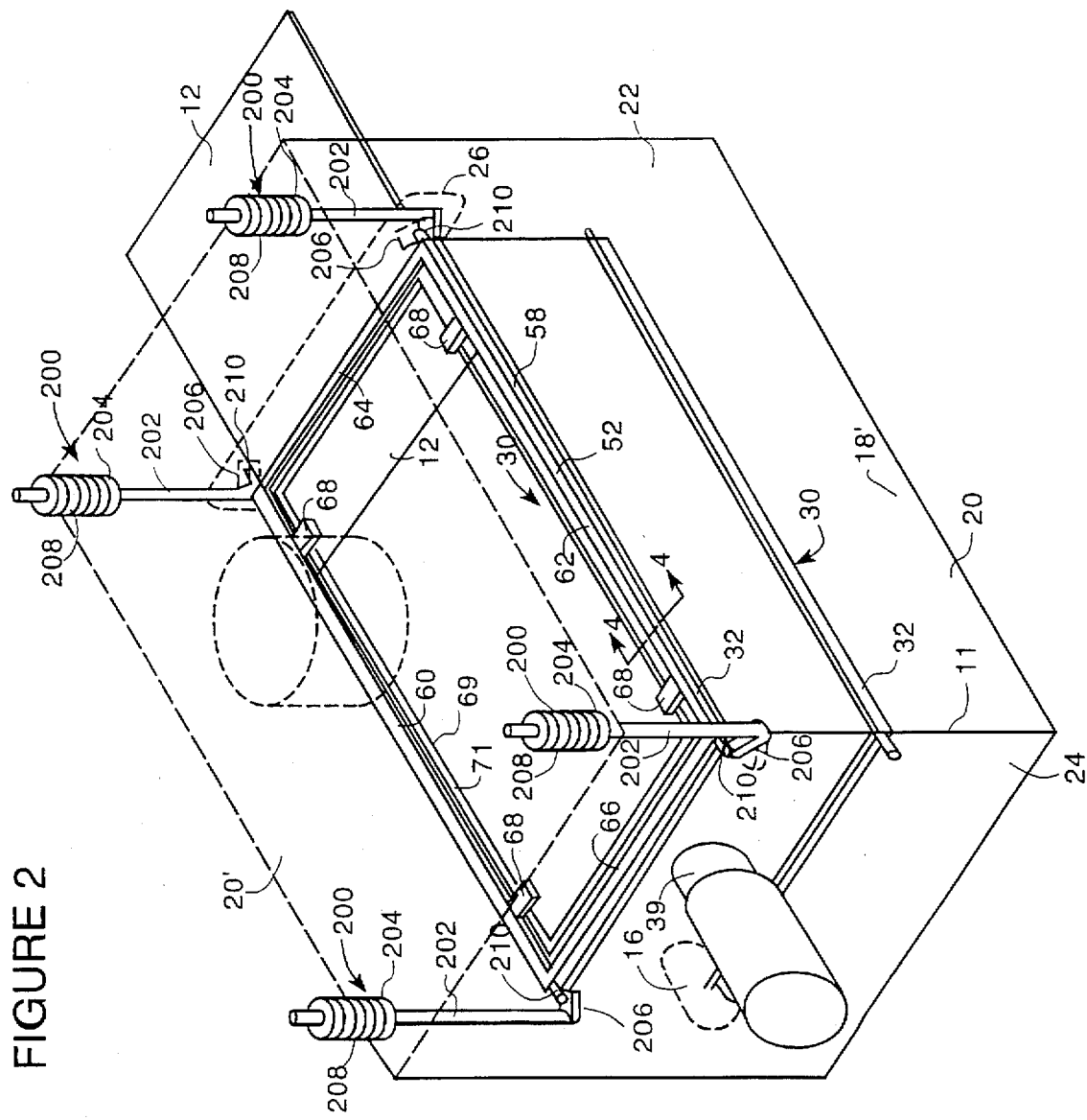
FIG. 2 is a perspective view of the etch chamber of the present invention with the chamber wall shown in phantom to reveal the support member positioned for the loading of substrates into the chamber and unloading of substrates from the chamber.

Referring to FIGS. 1 and 2, the etch chamber 10 of the present invention generally includes an enclosure wall 11 to enclose the support member 14 preferably configured as a cathode, and a support member drive system 16 located exterior of the chamber 10 on a moveable stand 280 (shown in FIG. 1) to rotate the support member 14 within the enclosure wall 11. The enclosure wall 11 includes generally rectangular opposed side wall 20, 20', having opposed first and second end walls 22, 24 (wall 22 shown in FIG. 2), a top 18 and a base 18'. As shown in FIG. 2, a slit valve 26 is provided through the first end wall 22 to provide access to the interior of the chamber 10 to place substrates 12 onto, and remove substrates 12 from, the support member 14. The support member drive system 16 is coupled, through a rotary vacuum coupling through the second end wall 24, to the support member 14 to permit rotation of the support member 14 about a horizontal axis within the chamber 10. The rotary coupling also passes utilities from outside the chamber 10 to within the chamber 10.

Figure 3:
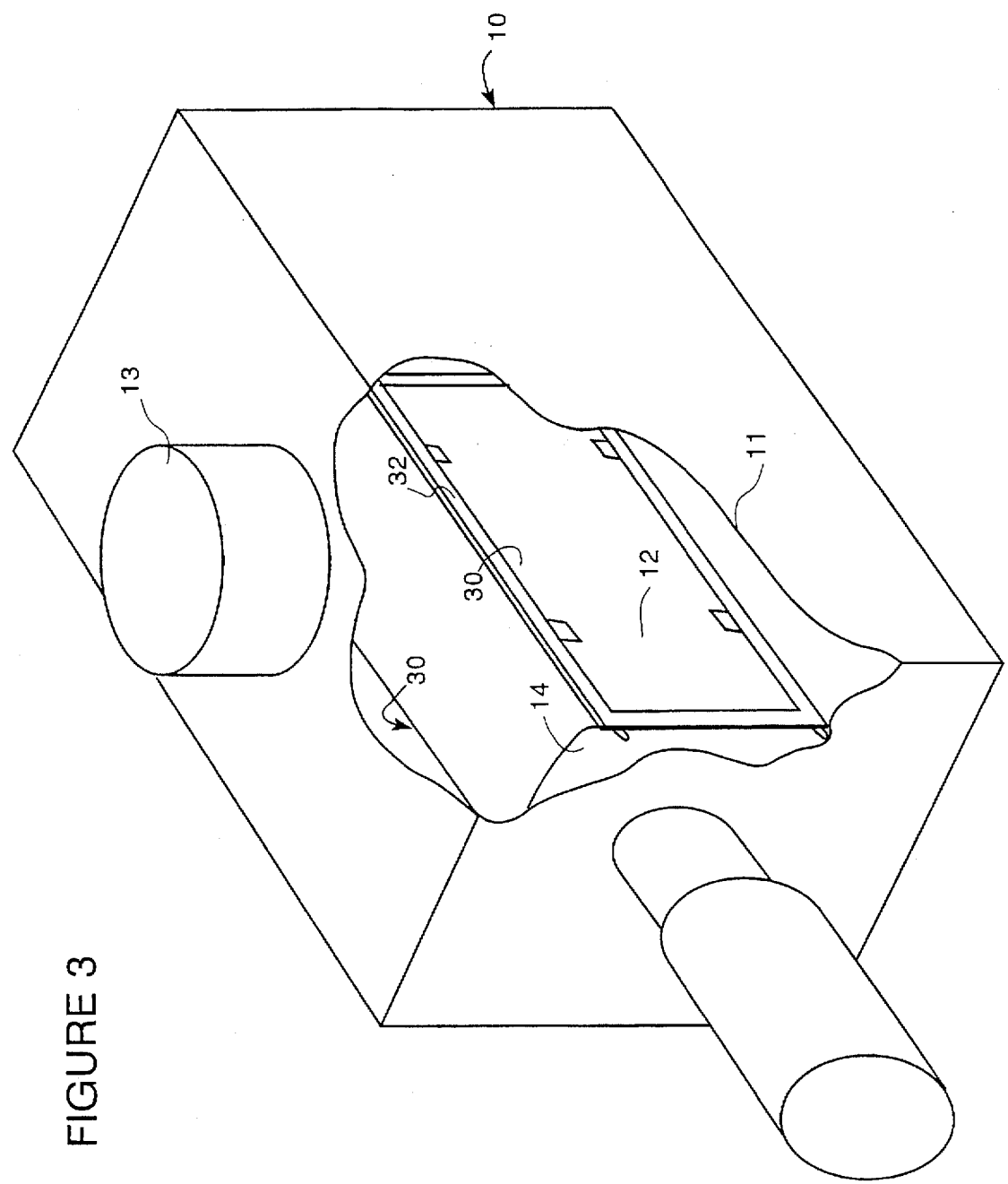
FIG. 3 is a perspective view, partially in section, of the etch chamber of the present invention with the support member positioned in the substrate etch position.

Referring now to FIG. 3, the etch chamber 10 of the present invention is shown in the etch position, wherein the support member 14 has been rotated ninety degrees with respect to its position in the loading position shown in FIG. 2. The chamber 10 may be configured as a reactive ion etch chamber, wherein a reactive plasma is provided intermediate the substrate 12 and the electrically grounded enclosure walls 11, to selectively etch the film layer on the exposed surface of the substrate 12. Therefore, the chamber enclosure wall 11 is electrically grounded, and the support member 14 is maintained at a negative voltage with respect to the plasma. An R.F. bias, at a frequency of 13.5 MHz, establishes a negative bias on the support member 14 because the electron mobility in the plasma is much greater than the ion mobility in the plasma. Preferably, the support member 14 is biased at a voltage of between 200 and 600 volts with respect to the chamber walls 11. The chamber 10 may alternatively be configured for other etch processes, using a triode configuration or a remote source where a plasma is formed exterior to the chamber and flowed past the substrate.

A conventional gas inlet (not shown) and a conventional chamber outlet (not shown) are provided to allow a gas or gases, having a selective etching affinity for portions of the film layer on the exposed surface of the substrate 12 when in the plasma state, to be maintained at a specified pressure within, and flow rate through, the chamber 10. The gas may be distributed within the chamber 10 through tubes having multiple holes therein, or other conduits. The chamber outlet includes at least one, and preferably two, vacuum pumps 13 (only one shown), such as a turbo-molecular pump to reduce the pressure in the chamber below approximately 200 milli-torr, preferably in the range of 15 to 40 milli-torr with a total gas flow of approximately 40 to 100 sccm. Gas mixtures including chlorine based chemistries, such as $BCl_3$, $Cl_2$, HCl, $CCl_4$ etc., are used to etch silicon, aluminum or reflective metals such as Ti, Ta or Cr. Gas mixtures having fluorine based chemistries are used to etch silicon nitride and $SiO_2$. Mixtures of the chlorine and fluorine based chemistries may be used to etch reflective metals such as Mo, Ta, MoTa, etc. Although the chamber 10 is preferably configured as an etch chamber, the apparatus of the present invention may be used for deposition processes, in particular, plasma deposition and chemical vapor deposition processes, and other etch processes, may be performed in the chamber 10.

The Substrate Support Member

Figure 6:
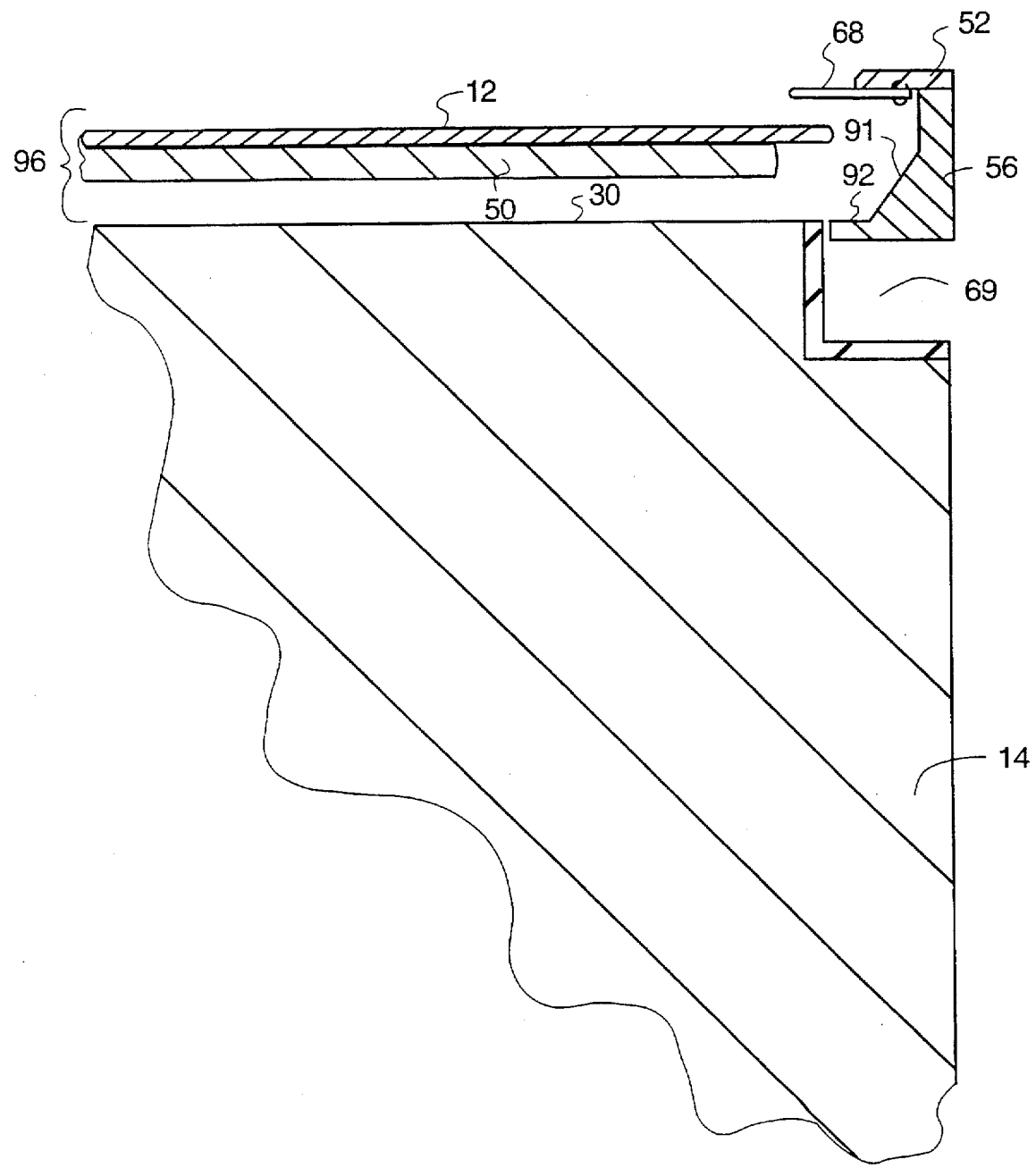
FIG. 6 is a partial sectional view of the support member of FIG. 2 positioned to receive a substrate thereon or remove a substrate therefrom.
Figure 7:
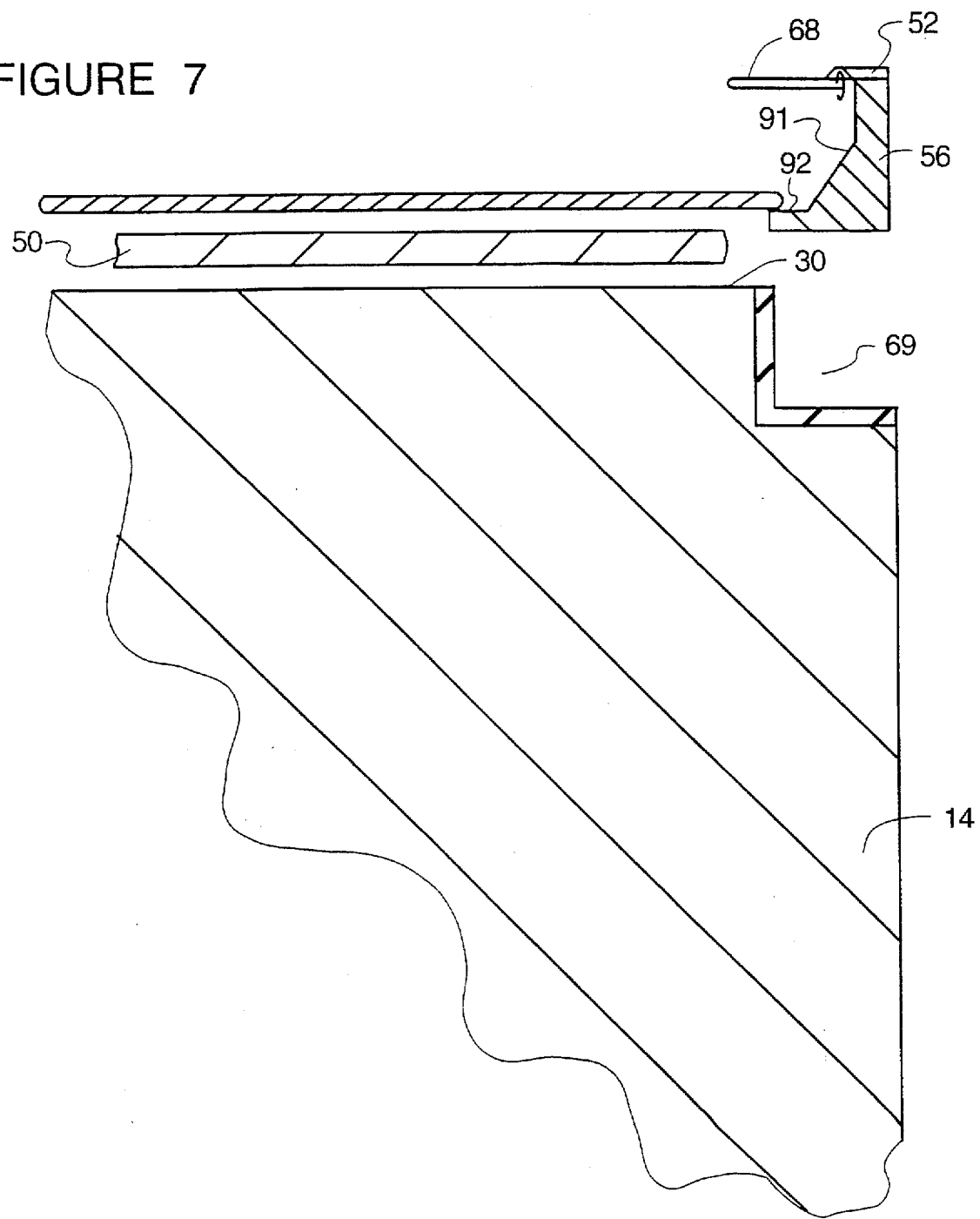
FIG. 7 is a partial sectional view of the support member of FIG. 1 positioned to actuate a robot blade under the substrate.

Referring now to FIGS. 2 and 3, the substrate support member 14 may be configured to permit simultaneous processing of multiple substrates 12 in the chamber 10. The support member 14 thus includes a plurality of, such as two, parallel substrate receiving faces 30 (only one shown in FIGS. 2 and 3) disposed on opposite sides of the support member 14, each of which are sized to receive a single substrate 12 thereon. The support member 14 also includes respective substrate clamp and lift assemblies 32 disposed on each of the substrate receiving faces 30. As will be further described herein, each of the clamp and lift assemblies 32 are selectively positionable at a clamping position wherein they clamp a substrate 12 to the support member 14, and at a loading/unloading position wherein they are positioned above the support member 14 to support the substrate 12 above the substrate receiving face 30 of the support member 14. In the loading/unloading position, a space is provided between the clamp and lift assembly 32 and the substrate receiving faces 30, as shown in FIGS. 6 and 7, to provide access for a robot blade 50 (shown in FIGS. 6 to 8) to place the substrate 12 on the support member 14 or remove the substrate 12 from the support member 14.

The support member 14 is also rotatable, about a horizontal axis, to move the substrate receiving faces 30 of the support member 14 between a horizontal loading position as shown in FIG. 2, and a vertical etching position, as shown in FIG. 3. Therefore, the support member 14 also includes a rotatable coupling 34, which extends from one end of the support member 14 through an aperture in the enclosure second end wall 24, where it terminates in connection with the support member drive member 16. The rotatable coupling 34 is preferably a tubular member, which is received in the support stand 280 disposed on the exterior of the second chamber wall 24 (shown in FIG. 1), as will be further described herein. The rotatable coupling 34 supports the support member 14 in the chamber 10, and also communicates utilities, such as gas, coolant and electrical feed lines into the support member 14. Although the support member is preferably cantilevered from the end wall 24, the support member may be supported off both end walls 22, 24.

The Substrate Clamp Assembly

Figure 4:
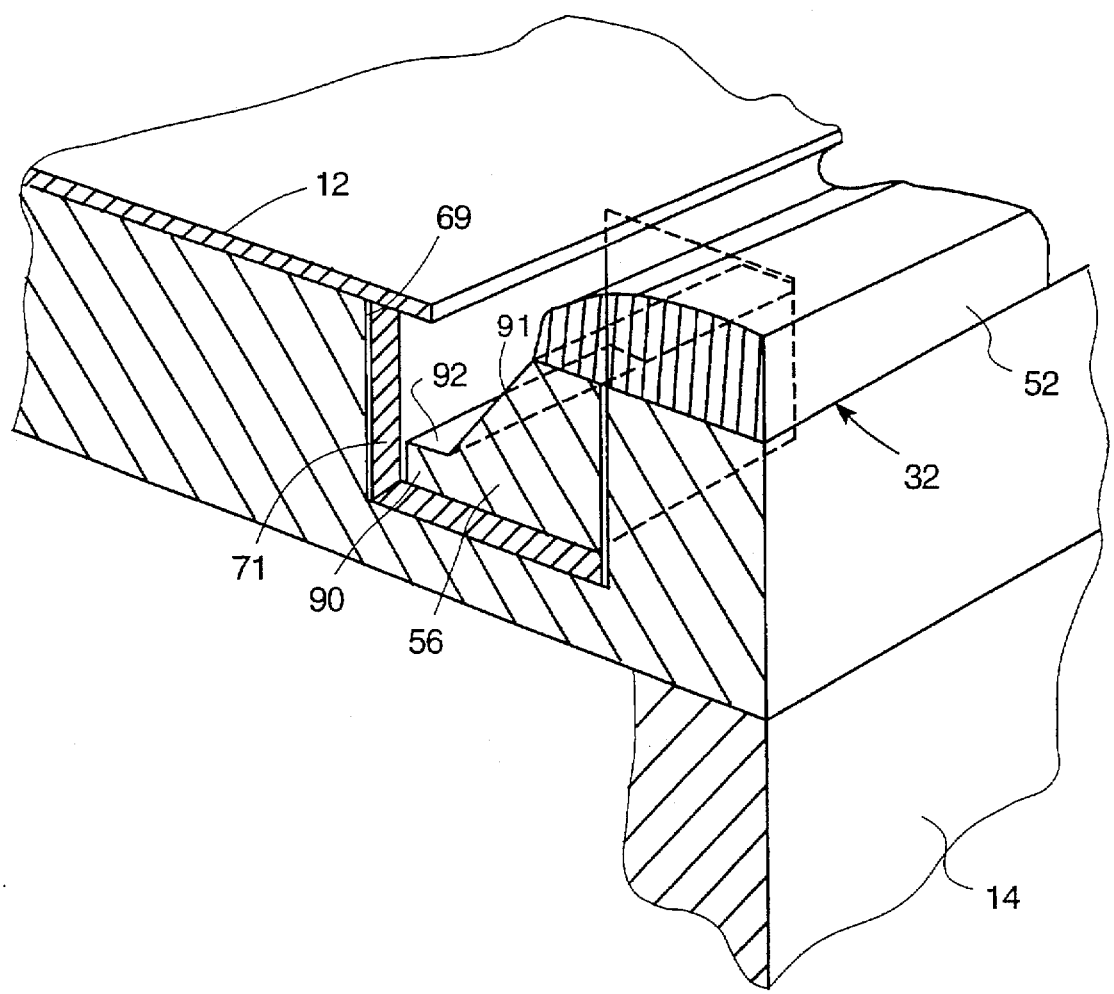
FIG. 4 is a partial perspective view, partially in section, of the support member of FIG. 2 along line 4—4.
Figure 5:
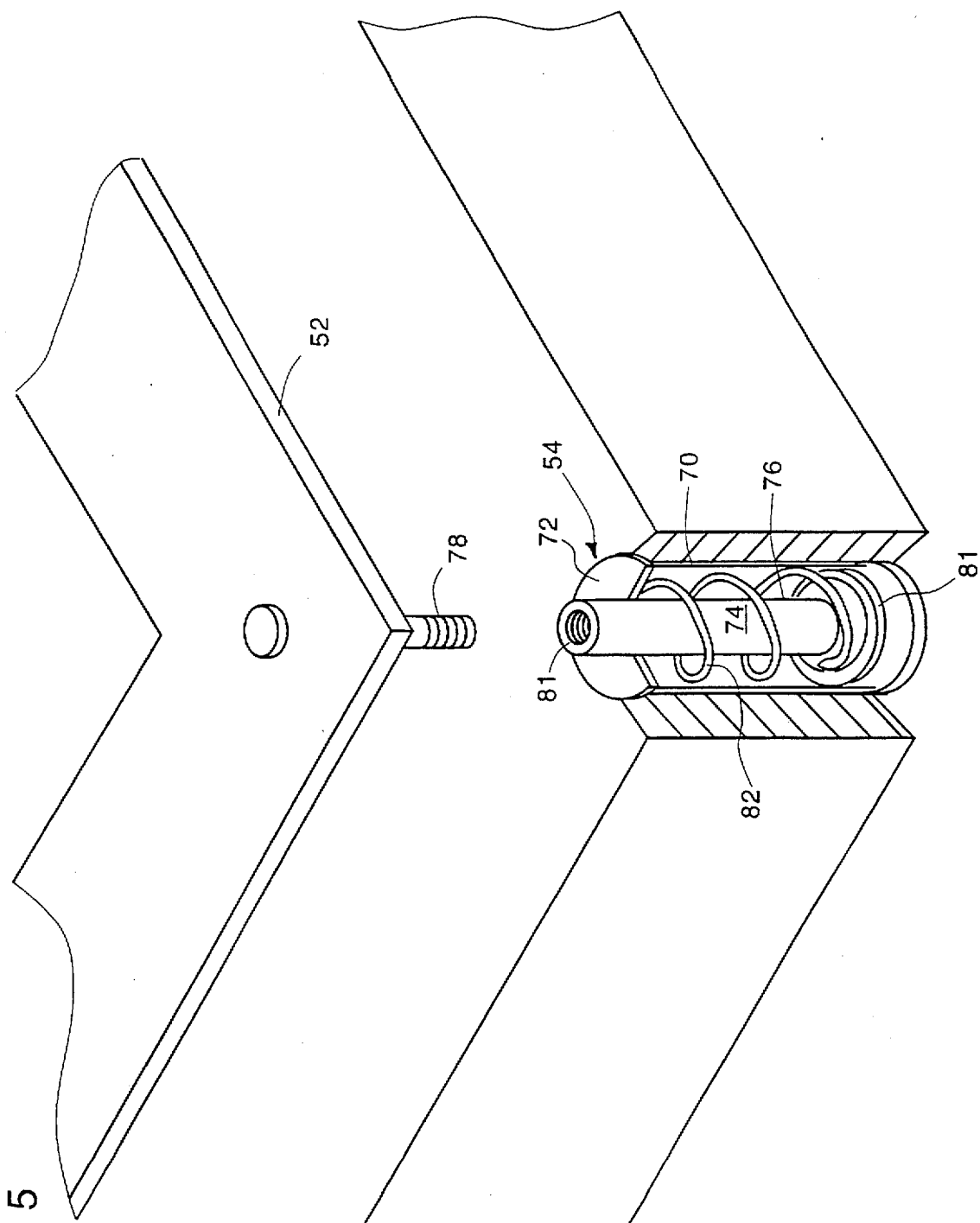
FIG. 5 is a partial perspective view, partially in section, of the clamp biasing member of the support member of FIG. 2.

Referring now to FIGS. 2, 4 and 5, the details of the substrate clamp and lift assemblies 32 are shown. A clamp and lift assembly 32 is received on each of the substrate support faces 30 of the support member 14, and therefore only one of the substrate clamp and lift assembly 32 will be described in detail. The substrate clamp and lift assembly 32 includes an annular clamp ring 52 sized to be received about the perimeter of the substrate receiving face 30 of the support member 14, such that a substrate 12, when received on the substrate receiving face 30, is received within the envelope of the substrate clamp and lift assembly 32. The clamp and lift assembly 32 also includes a plurality of clamp biasing members 54 (shown in FIG. 5) disposed intermediate of the clamp ring 52 and the support member 14, and a plurality of substrate lift members 56 (as shown in FIG. 4) disposed about the perimeter of the clamp ring 52. Where the substrate 12 is a rectangle, the clamp ring 52 is likewise an annular rectangle.

Referring to FIG. 2, the clamp ring 52 includes a plurality of individual rail members 58, including opposed first side rail members 60, 62 perpendicularly connected to opposed second side rail members 64, 66, to form the rectangular profile. A plurality of clamp fingers 68, preferably ceramic, extend inwardly from the first side rail members 60, 62 by a distance sufficient to engage over the top, exposed surface of a substrate 12 received on the substrate receiving face 30 of the support member 14. The clamp fingers 68 are preferably adjustable longitudinally along the rail members 60, 62, to allow the clamp 52 to clamp substrates 12 of different lengths to the support member 14. The fingers 68 may be adjusted by providing a plurality of threaded holes (not shown) in the clamp rails 60, 62, and affixing the fingers 68 to selective ones of the threaded holes with a fastener such as a bolt. The clamping ends of the clamp fingers 68 are preferably sized to fit only slightly inwardly of the edge of a substrate 12 received on the substrate receiving face 30 of the support member, to minimize shadowing on the substrate 12.

The clamp ring 52 is preferably manufactured from an insulative material, although conductive materials may also be used. To limit any electric conductance from the clamp ring 52 to the substrate 12, the clamp fingers 68 are preferably manufactured from an insulative material, such as ceramic, and the support member includes an annular channel 69 therein, which extends about the perimeter of the substrate receiving face and receives an insulative member 71 therein, formed from a material such as ceramic, to form an insulating barrier between the clamp ring 52 and the substrate 12 (best shown in FIG. 4).

The Structure and Operation of the Clamp Biasing Members

The clamp ring 52 is connected to, and spring biasable toward, the support member 14 by a plurality of the clamp biasing members 54 as shown in FIG. 5. Preferably, a clamp biasing member is located at each corner of the clamp ring 52. Each of the clamp biasing members 54 include a housing 70 extending inwardly of the support member 14 and terminating at the surface of the support member 14 in an upper flange 72, and a spring loaded pin 74 extending within the housing 70 and terminating outwardly of the housing 70 adjacent to the flange 72. The spring loaded pin 74 includes a shaft portion 76, which is received on a piston member 80 located within the housing 70, and an extending portion 81 formed as an extension of the shaft portion 76 extending outwardly of the support member 14 through the upper flange 72. A spring 82 extends within the housing 70 between the flange 72 and the piston member 80, to bias the piston member 80, and thus the shaft portion 76, inwardly of the housing 70. The extending portion 81 of the spring loaded pin 74 is connected to the clamp ring 52. Preferably, the extending portion 81 of the pin 74 includes an internal threaded bore, and a bolt 78 extends through the clamp ring 52 and into the threaded bore to secure the clamp ring 52 to the clamp biasing member 54. Thus, the clamp ring 52 may be readily removed from the support member for servicing, by simply removing the bolts 78 (only one shown) which secure the clamp ring to the clamp biasing members 54.

The clamp biasing members 54 bias the clamp ring 52, and thus the clamp fingers 68 extending from the clamp ring 52 over the substrate 12, toward the support member 14. Thus, the clamp biasing members 54 are used to maintain the clamp fingers 68 in contact with the substrate 12, and thus the substrate 12 in contact with the support member 14, throughout the etch process. The springs 82 in the biasing members 54 must maintain sufficient force on the substrate 12 to maintain contact between the substrate 12 and the support member 14 as the support member 14 is rotated in the chamber. With a 550 mm by 650 mm glass substrate 12, using four clamp biasing members 54 to secure the substrate 12 to the support member 14, a spring force of approximately 0.13 N/cm$^2$ is sufficient to maintain the substrate 12 on the support member 14 as the support member 14 is rotated in the chamber 10. However, to ensure that the substrate 12 is maintained on the support members, the springs 82 may be variable force springs, such that the spring force increases when the springs 84 are compressed, which occurs when the clamp ring 52 moves away from the adjacent face of the support member 14.

The Substrate Lifting Apparatus

Referring now to FIG. 4, the clamp ring 52 further includes a plurality of the substrate lift members 56 (only one shown) extending from the clamp ring 52 to a position intermediate the substrate 12 and the support member body 14. One lift member 56 is preferably provided on the underside of each end of the opposed first rail members 60, 62 of the clamp ring 52, and a groove, or recess, is provided in the annular insulative member 71 to allow the lift member 56 to be recessed into the support member 14 when the clamp ring 52 is positioned to clamp the substrate 12 to the support member 14. Lift members 56 may also be located in the end rail 66 disposed opposite to the position of the slit valve 26. Each lift member 56 includes an offset lip portion 90 which extends inwardly of the clamp ring 52 in a parallel offset relation to the generally planar underside of the first clamp side rail members 60, 62, and a centering member 91 which extends at an oblique angle to the upper surface of the lip portion 90, intermediate of the lip portion 90 and the clamp rails 60, 62. The lip portion 90 includes a generally planar upper substrate engaging face 92, which is moveable with respect to the substrate 12, to lift the substrate from the support member 14 as will be further described herein.

Figure 9:
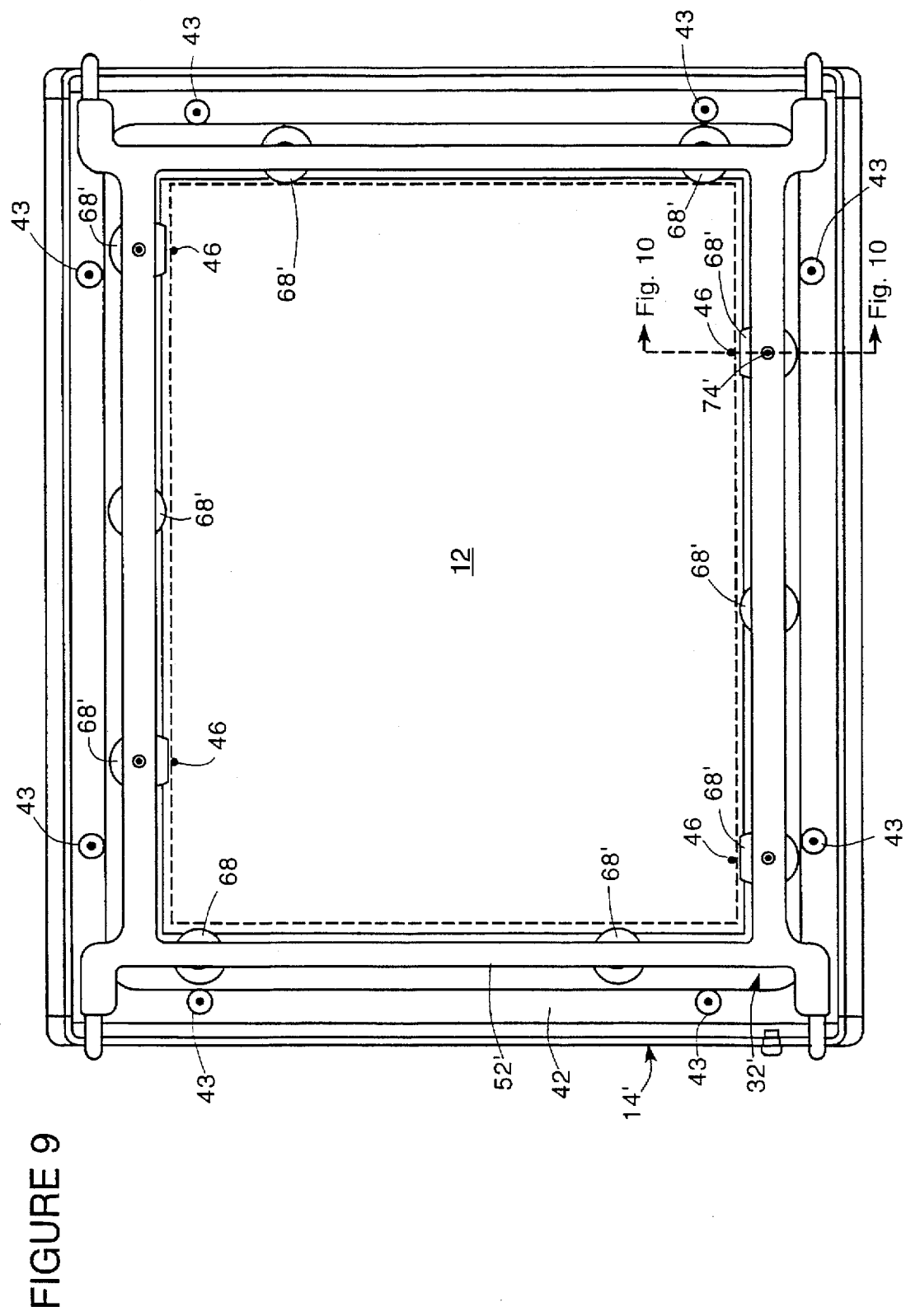
FIG. 9 is a top plan view of an alternative embodiment of the support member, the clamp and lift assembly, and the clamp biasing member of the present invention.
Figure 10:
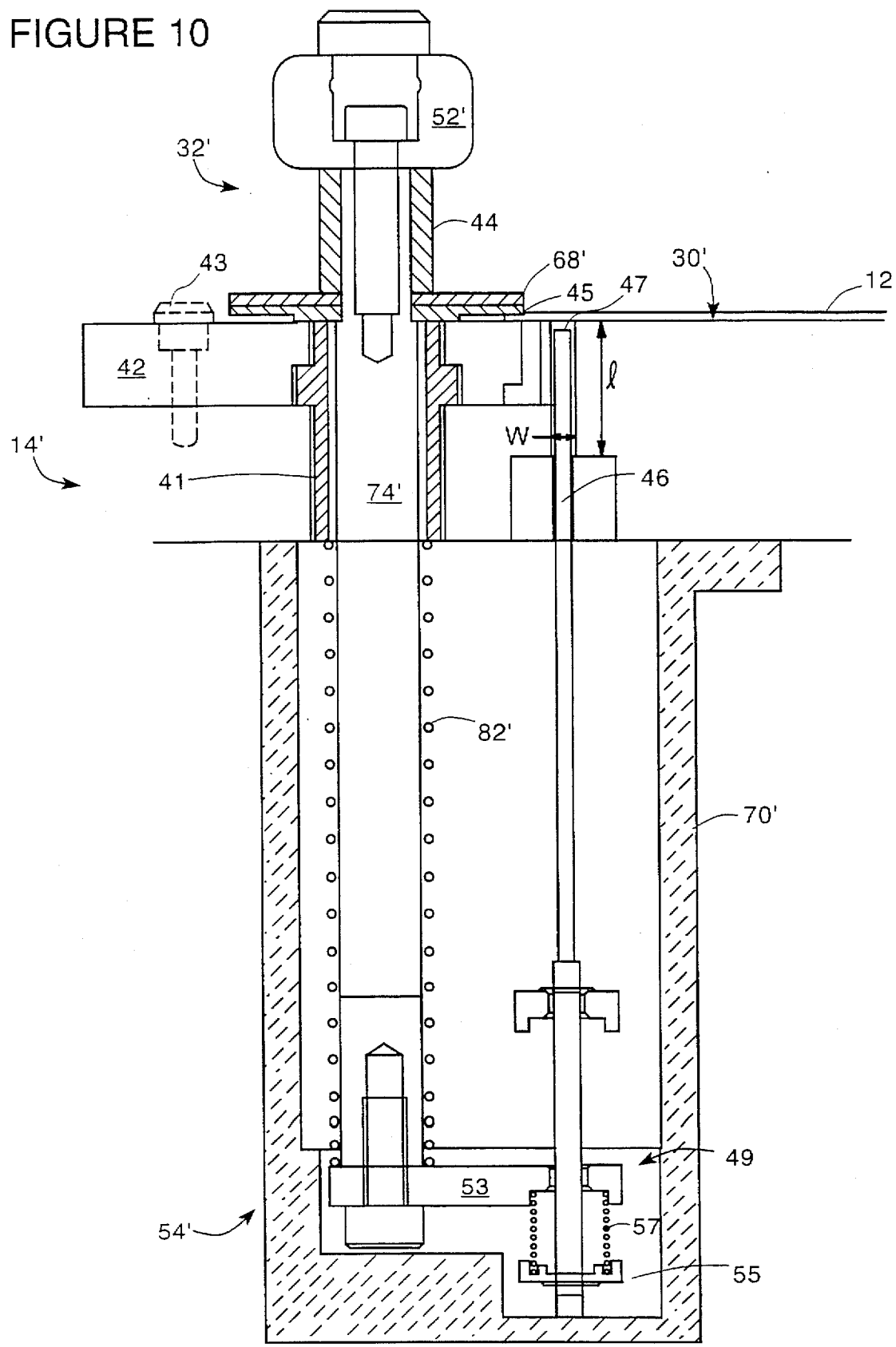
FIG. 10 is an enlarged, partial sectional view of the support member, the clamp and lift assembly, and the clamp biasing member of FIG. 9 along line 10—10.

Alternative Embodiment of the Substrate Support Member, Clamp and Lift Assembly and Clamp Biasing Members An alternative embodiment of the substrate support member 14, the clamp and lift assembly 32, and the clamp biasing members 54 according to the present invention are respectively provided by substrate support member 14', the clamp and lift assembly 32', and the clamp biasing members 54', as shown in FIGS. 9 and 10. These alternative embodiments are especially adapted to eliminate the arcing which may occur at the high power densities necessary to etch certain films on substrates 12, such as aluminum film. The support member 14', the clamp and lift assembly 32', and the clamp biasing members 54' of the alternative embodiment have a similar structure and operation to the support member 14, the clamp and lift assembly 32, and the clamp biasing members 54 described above, except for the modifications that will now be described.

Referring to FIGS. 9 and 10, the spring-loaded pins 74' of the clamp biasing members 54' are made of an electrically-insulative material, preferably the polyimide Vespel®, manufactured by Dupont de Nemours and Co. (Wilmington, Del.). Insulating sleeves 41 are disposed in the support member 14' and surround each of the spring-loaded pins 74'. The insulating sleeves 41 are also made of an electrically-insulative material, preferably the polyimide Vespel®. The spring-loaded pins 74' and insulating sleeves 41 electrically isolate the clamp ring 52' from the support member 14'.

An insulating collar 42 is disposed about the perimeter of the substrate receiving face 30' of the support member 14'. The insulating collar 42 is preferably 0.4 inches or greater in thickness and is made of an electrically-insulative material, preferably the polycarbonate Lexan®, manufactured by GE Plastics (Pittsfield, Mass.). The insulating collar 42 is fastened to the support member 14' by means of screw caps 43, which are also preferably made of the polycarbonate Lexan®. The insulating collar 42 shields the support member 14' from exposure to the plasma during the etching process, thereby suppressing arcing between the clamp ring 52 and the support member 14'.

Spacers 44 are disposed between the clamp ring 52' and each clamp finger 68'. Spacers 44 are preferably 0.7 inches or greater in length and are made of an electrically-insulative material, preferably quartz. Spacers 44 provide a gap between the clamp ring 52' and the substrate 12 to eliminate the shadowing of the substrate that would otherwise be caused by the clamp ring during the etching process. The gap also electrically isolates the clamp ring 52' from the support member 14'.

Insulating layers 45 are disposed on the surfaces of the clamp fingers 68' facing the substrate 12. The insulating layers 45 are preferably made of the polyimide Vespel®. The insulating layers 45 provide further electrical isolation of the clamp ring 52' from the substrate and prevent the clamp fingers 68', which are preferably ceramic, from scratching the substrate 12.

A plurality of lift pins 46 are disposed in the housing 70' of the clamp-biasing mechanism 54' and through openings 47 in the support member 14'. The lift pins 46 may be made of a metal such as steel. The lift pins 46 replace the lift members 56 of the clamp ring 52 described above in moving the substrate 12 toward or away from the support member 14'. The lift pins 46 are slidably movable in a direction perpendicular to the substrate receiving face 30 of the support member 14'. A pin-biasing mechanism 49 is attached to each lift pin 46, comprising a flange 53, a piston member 55 attached to the lift pin and a spring 57 extending between the flange 53 and the piston member 55. The flange 53 is attached to the shaft portion 76 of each spring-loaded pin 74, thereby coordinating the movement of the lift pins 46 with that of the spring-loaded pins 74, as described in further detail below. The pin-biasing mechanism 49 provides the movement of the lift pins 46 with compliance such that the spacing between the ends of the lift pins 46 and the clamp fingers 68 may be varied appropriately.

The replacement of the lift members 56 by the lift pins 46 provides several benefits. First, the support member 14' may be constructed without the channel 69 used to accomodate the lift members, thereby eliminating a possible source of arcing. Second, since the clamp ring 52' no longer includes the lift members, the weight of the clamp ring is reduced. As a result, the tendency of the clamp ring 52' to pull away from the substrate 12 due to its weight as the support member 14' is rotated is minimized.

The openings 47 in the support member 14' accomodating the lift pins 46 may have a relatively large aspect ratio, i.e., length l versus width w. For example, the aspect ratio may be 10:1 or larger. Providing the openings 47 with such an aspect ratio minimizes entry of a plasma in the chamber 10 into the housing 70', thereby preventing arcing from occurring within the housing 70'.

The housing 70' of the clamp-biasing mechanism 54' is disposed entirely outside, rather than within, the support member 14'. The housing 70' is made of an insulating material, preferably the polycarbonate Lexan®. These modifications electrically isolate the springs 82', thereby preventing arcing from occurring within the housing 70'.

The substrate receiving faces 30' of the support member 14' may be tilted toward each other by a few degrees, rather than being parallel as described earlier. This arrangement of the substrate receiving faces 30' provides for the substrates 12 to lean slightly against the substrate receiving surfaces 30' while the support member 14' is oriented in a vertical position, thereby improving the contact of the substrates against the substrate receiving surfaces.

The Operation of the Clamp and Lift Assembly

Figure 8:
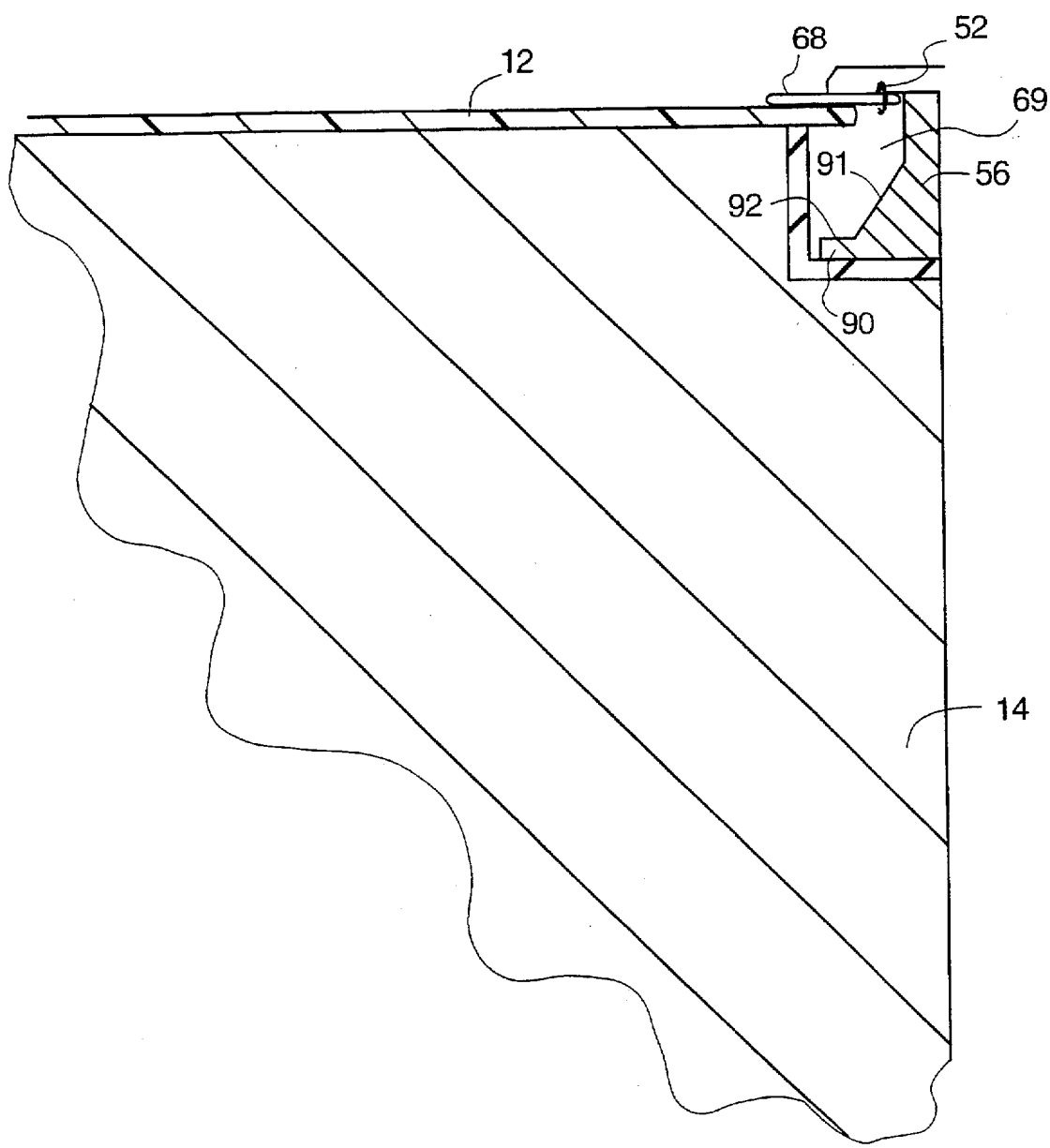
FIG. 8 is a partial sectional view of the support member of FIG. 1 positioned to clamp a substrate thereon for etching in the chamber.

Referring now to FIGS. 6, 7 and 8, the clamp and lift assembly 32 is configured to interact with a robot blade 50 (shown in FIGS. 6 and 7), to remove the substrate from the robot blade 50 and then position and clamp the substrate 12 on the support member 14, and to lift the substrate 12 from the support member to position the substrate 12 to be removed from the chamber 10 by the robot blade 50. To prepare for the loading of a substrate 12 onto the support member 14, the clamp ring 52 is actuated away from the support member 14 to the position shown in FIG. 6. In this position, the clamp fingers 68 are spaced from the substrate receiving face 30 of the support member 14, but the substrate engaging surface 92 of the lifters 56 remains recessed at or below the substrate receiving face 30 of the support member 14. Thus, a substrate insertion gap 96 is supplied between the support member 14 and the fingers 68, and this gap 96 is of sufficient size to allow a substrate 12, and a robot blade 50 supporting the substrate 12, to be inserted horizontally between the support member 14 and the clamp fingers 68 on the underside of the clamp ring 52.

In the alternative embodiment of FIGS. 9 and 10, the clamp ring 52' is positioned such that the clamp fingers 68' are spaced from the substrate receiving face 30' of the support member 14' at a sufficient distance to allow a substrate 12, and a robot blade 50 supporting the substrate 12, to be inserted horizontally between the support member 14' and the clamp fingers 68'. The lift pins 46' are recessed within the substrate receiving face 30' of the support member 14' by means of the compliance provided by pin-biasing member 49.

Referring again to FIGS. 6, 7 and 8, once the robot blade 50 positions the substrate 12 between the support member 14 and the partially raised clamp ring 52, the clamp ring 52 is actuated further outwardly from the support member 14 as shown in FIG. 7, to engage with the underside of the substrate 12 the substrate receiving surfaces 92 of the lift members 56 and then lift the substrate 12 off the robot blade 50. If the substrate 12 is misaligned with respect to the substrate receiving face 30, the centering face 91 of one or more lift members 56 will engage the edge of the substrate 12 and move it inwardly of the adjacent clamp rail 60 or 62 to align the substrate 12 for receipt on the substrate receiving face 30 of the support member 14. Once the substrate 12 is supported in the chamber 10 by the lift members 56, the robot blade 50 may be retracted from the chamber 10 through the slit valve 26.

In the alternative embodiment, the clamp ring 52' and the lift pins 46 are cooperatively actuated outwardly of the substrate receiving face 30' to engage with the underside of the substrate 12 and then lift the substrate 12 off the robot blade 50.

To position the substrate 12 on the support member 14, the clamp ring 52 is moved in the direction of the substrate receiving face 30 of the support member 14 to the position shown in FIG. 8. The clamp ring 52 preferably moves from the fully extended position shown in FIG. 7 to the clamping position in FIG. 8 at a continuous, relatively slow speed to ensure that the substrate 12 is not chipped or cracked by the engagement of the substrate 12 against the support member 14 or of the fingers 68 against the substrate 12. However, the clamp ring 52 motion may occur in discrete, or continuous, multiple speed steps, to reduce the time needed to clamp the substrate 12 to the support member 14. To remove a substrate 12 from the chamber, the sequence of movements of the clamp ring 52 are reversed.

In the alternative embodiment, the clamp ring 52' and the lift pins 46' are cooperatively moved in the direction of the substrate receiving face 30' of the support member 14' until the clamp ring engages with the surface of the substrate and the lift pins are fully recessed within the substrate receiving face 30' of the support member 14'.

The placement of the substrate 12 on and off the support member 14 requires complete clearance of the robot blade 50 and substrate 12 as they are actuated inwardly and outwardly of the chamber 10. If the substrate 12 or the robot blade 50 touches the clamp and lift assembly 32 or the support member 14 as they are moving inwardly or outwardly of the chamber, contaminating particles will be generated by the movement of these part surfaces on each other, or worse, the substrate 12 can be chipped, cracked or otherwise damaged. Thus, the clearance between the substrate receiving face 30 of the support member and the clamp fingers 68 must be sufficient to permit the robot blade and substrate 12 to pass between the fingers 68 and the substrate receiving face 30 without touching either component. Then, only after the substrate 12 has stopped moving with respect to the support member 14, may the clamp and lift assembly 32 be operated to lift the substrate off the robot blade.

The Clamp Actuator Structure

The movement of the clamp ring 52 between the clamping position and the extended position is preferably actuated with four actuating members 200 which, as shown in FIG. 2, are mounted on the top enclosure wall 11. By locating the actuating members 200 on the enclosure wall 11, each of the clamp rings 52 may be positioned adjacent to the actuating members 200 by rotating the support member 14 to position the clamp ring 52 adjacent the actuator members 200.

The clamp actuators 200 move the clamp ring 52 between the positions shown in FIGS. 6, 7 and 8. The clamp actuators 200 may be inwardly extendable from the top enclosure wall 11 of the chamber 10 to selectively engage the clamp ring 52, and may be outwardly retractable into the enclosure wall 11 during substrate 12 etching to prevent, or minimize, etching of the actuator 200. As best shown in FIG. 2, the actuators 200, which may be four in number, each include a rod 202 which extends through an aperture 204 in the enclosure wall 11 of the chamber 10 and terminate inwardly of the chamber 10 in a hook portion 206. The rods 202 are linearly actuable inwardly and outwardly of the chamber 10, and are rotatable about their longitudinal axis. A bellows 208 is provided on the exterior of the enclosure wall 11 about each of the apertures 204 in the enclosure wall 11. The outermost end of the bellows 208 is sealingly engaged to the rod 202, such as with a lip seal, to seal the aperture 204 through the enclosure wall 11.

Preferably, one actuator 200 is provided to lift each corner of the clamp ring 52. Thus, where the substrate 12, and thus the clamp ring 52, are rectangular, four actuators 200 are provided. To move the clamp ring 52 between the positions shown in FIGS. 6 to 8, the rod 202 of each actuator 200 is first actuated from a fully retracted position from the chamber 10 to a position, as shown by phantom lines in FIG. 2, wherein the hook 206 is disposed immediately adjacent, and below, the clamp ring 52. The rod 202 is then rotated to place the hook 206 immediately below the edge of the clamp ring 52. Then, all four rods 202, with the hooks 206 thereof placed underneath the clamp ring 52, are simultaneously retracted through the enclosure wall to lift the clamp ring 52 from the support member 14. The rods 202 simultaneously move to position the clamp ring 52 in the positions shown in FIGS. 6, 7 and 8, to permit loading and unloading of the substrate 12 on the support member 14.

The placement of the hooks 206 under the clamp ring 52, followed by retraction of the rod 202 through the aperture 204, is sufficient to link the clamp ring 52 to the clamp actuators 200 to move the clamp ring 52 between the substrate loading and clamping positions. However, the clamp ring 52 may further include, at each corner thereof, an outwardly extending lifting rod 210. Thus, as the hook 206 is moved upwardly from a position below the clamp ring 52 to lift the clamp ring 52 from the support member 14, the end of the rod 210 is received on the hooks 206 which causes the hook 206 to align itself with the lifting rod 210.

The clamp actuators 200 are located in the chamber 10 to load the substrate 12 on each substrate receiving face 30 of the support member 14. For example, where the support member 14 has two substrate receiving faces 30, a substrate 12 is loaded onto one of the substrate receiving surfaces 30, and the support member 14 is then rotated 180° to locate the other substrate receiving surface 30 adjacent the clamp actuators 200. The actuators 200 move the clamp ring 52 on this second substrate receiving surface 30 to position the substrate 12 on the support member 14 for processing.

The apparatus of the present invention is particularly useful for the processing of large flat panel displays, and other large members, particularly in etch applications where the heat transfer rate from the substrate 12 and into the support member 14 limits the maximum power density of the plasma. Using the chamber 10 of the present invention, two substrates 12 may be simultaneously processed, at the same 0.25 to 1.25 w/cm$^2$ power density as the prior art, to double the throughput of substrates 12 through a chamber 10 at the same power density previously used to process only one substrate 12. Additionally, by flowing a gas between the substrate 12 and the support member 14, the power density may be increased to further increase the etch rate, and thus the throughput of substrates 12 through the chamber 10.

The present invention has been described in terms of a representative embodiment. The invention, however, is not limited to the embodiment depicted and described. Rather, the scope of the invention is defined by the appended claims.

What is claimed is:

1. An apparatus for etching film layers on a plurality of substrates, comprising:

an enclosure;

a substrate support member including a plurality of planar substrate receiving surfaces thereon, wherein said support member is positionable in a first position wherein at least one of said planar substrate receiving surfaces is disposed in a horizontal position to receive a substrate thereon and further positionable in a second position, different than said first position, for etching a film layer on the substrate;

a clamp member selectively positionable with respect to at least one of said substrate receiving surfaces for engaging the substrate; and an insulating member disposed between said substrate support member and said clamp member so as to electrically isolate said clamp member from said substrate support member.

2. The apparatus of claim 1 wherein said insulating member comprises a pin within a clamp-biasing member coupled to said substrate support member and said clamp member, and an insulating sleeve disposed about said pin and within said substrate support member, said pin and said insulating sleeve composed of an insulative material.

3. The apparatus of claim 1, wherein said insulating member comprises an insulating collar disposed about the perimeter of said at least one of said substrate receiving surfaces.

4. An apparatus for etching film layers on a plurality of substrates, comprising:

an enclosure;

a substrate support member including a plurality of planar substrate receiving surfaces thereon, wherein said support member is positionable in a first position wherein at least one of said planar substrate receiving surfaces is disposed in a horizontal position to receive a substrate thereon and further positionable in a second position, different than said first position, for etching a film layer on the substrate; and a clamp member selectively positionable with respect to at least one of said substrate receiving surfaces for engaging the substrate, said clamp member including a clamp ring and a spacer, said spacer providing a gap between said clamp ring and said substrate upon said substrate engagement.

5. An apparatus for etching film layers on a plurality of substrates, comprising:

an enclosure;

a substrate support member including a plurality of planar substrate receiving surfaces thereon, wherein said support member is positionable in a first position wherein at least one of said planar substrate receiving surfaces is disposed in a horizontal position to receive a substrate thereon and further positionable in a second position, different than said first position, for etching a film layer on the substrate;

a clamp member selectively positionable with respect to at least one of said substrate receiving surfaces for engaging the substrate; and a plurality of lift pins disposed in said substrate support member, said lift pins being selectively engagable to move the substrate toward or away from said at least one of said substrate receiving surfaces.

6. An apparatus for etching film layers on a plurality of substrates, comprising:

an enclosure;

a substrate support member including a plurality of planar substrate receiving surfaces thereon, wherein said support member is positionable in a first position wherein at least one of said planar substrate receiving surfaces is disposed in a horizontal position to receive a substrate thereon and further positionable in a second position, different than said first position, for etching a film layer on the substrate;

a clamp member selectively positionable with respect to at least one of said substrate receiving surfaces for engaging the substrate; and a clamp biasing member coupled to said clamp member and said substrate support member, said clamp biasing member including a housing disposed external to said substrate support member.

7. The apparatus of claim 6, wherein said clamp biasing member further includes a spring-loaded pin.

8. The apparatus of claim 6, wherein said clamp biasing member is made of an insulative material.

9. An apparatus for etching film layers on a plurality of substrates, comprising:

an enclosure;

a substrate support member including a plurality of planar substrate receiving surfaces thereon, wherein said support member is positionable in a first position wherein at least one of said planar substrate receiving surfaces is disposed in a horizontal position to receive a substrate thereon and further positionable in a second position, different than said first position, for etching a film layer on the substrate; and wherein said substrate receiving surfaces are nonparallel.

10. A method for positioning substrates on, and clamping substrates to, a substrate receiving surface disposed within a chamber having an enclosure wall and an access aperture through the enclosure wall, comprising:

providing a plurality of lift pins selectively positionable with respect to the substrate receiving surface;

providing a clamp ring having a clamp finger selectively positionable with respect to the substrate receiving surface;

positioning the lift pins in a first position, wherein the lift pins are disposed completely within the substrate receiving surface;

positioning the clamp ring in a first position, wherein the clamp finger is spaced from the substrate receiving surface;

placing a substrate, disposed on a support blade, intermediate the substrate receiving surface and the clamp finger;

moving the lift pins outwardly of the substrate receiving surface to lift the substrate from the support blade;

retracting the support blade from the enclosure; and moving the clamp ring and the lift pins to position the substrate on the substrate receiving surface and to place the clamp finger in engagement with the substrate, the clamp ring maintaining a gap with the substrate.

* * * * *